(12) United States Patent
Park

(10) Patent No.: US 9,858,142 B2
(45) Date of Patent: Jan. 2, 2018

(54) SEMICONDUCTOR DEVICE

(71) Applicant: SK hynix Inc., Icheon-si, Gyeonggi-do (KR)

(72) Inventor: Min Su Park, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/062,557

(22) Filed: Mar. 7, 2016

(65) Prior Publication Data

US 2017/0132072 A1 May 11, 2017

(30) Foreign Application Priority Data

Nov. 9, 2015 (KR) .......................... 10-2015-0157004

(51) Int. Cl.
*G06F 11/10* (2006.01)
*G11C 11/406* (2006.01)
*G11C 11/408* (2006.01)
*H03M 13/00* (2006.01)

(52) U.S. Cl.
CPC ........ *G06F 11/1044* (2013.01); *G11C 11/406* (2013.01); *G11C 11/4082* (2013.01); *G11C 11/4085* (2013.01); *H03M 13/6566* (2013.01); *G11C 2211/4062* (2013.01)

(58) Field of Classification Search
CPC .. G06F 11/10; G06F 11/1044; G06F 11/1048; G06F 11/1008; G11C 29/42; G11C 29/52; G11C 11/4082; G11C 11/4085
See application file for complete search history.

(56) References Cited

U.S. PATENT DOCUMENTS

| 6,996,766 | B2 * | 2/2006 | Cypher ............... G06F 13/1668 |
| | | | 714/6.2 |
| 7,184,351 | B2 * | 2/2007 | Ito ........................ G11C 11/406 |
| | | | 365/222 |
| 7,949,928 | B2 * | 5/2011 | Lee ..................... G06F 11/1008 |
| | | | 365/185.09 |
| 8,180,994 | B2 | 5/2012 | Sprouse et al. |

(Continued)

FOREIGN PATENT DOCUMENTS

| KR | 1020120055544 A | 5/2012 |
| KR | 1020130117198 A | 10/2013 |

(Continued)

*Primary Examiner* — Shelly A Chase
(74) *Attorney, Agent, or Firm* — William Park & Associates LTD.

(57) ABSTRACT

Provided is a semiconductor device including an error correction code circuit. The semiconductor device includes a bank including a memory area for storing data and an error correction for storing parity data, an error correction code calculation circuit that corrects an error of a failed cell in correspondence to the data and the parity data and outputs a flag signal activated at a time of a generation of failed data and an address activated in the bank, an address latch circuit that stores the address applied from the error correction code calculation circuit and outputs a failed address according to the flag signal, and a fail prevention circuit that performs an operation for repairing the failed data in correspondence to the flag signal and the failed address.

21 Claims, 3 Drawing Sheets

(56) References Cited

U.S. PATENT DOCUMENTS

| | | | |
|---|---|---|---|
| 8,630,141 | B2 | 1/2014 | Tamlyn |
| 8,923,084 | B1 | 12/2014 | Song |
| 8,976,604 | B2 | 3/2015 | Hung |
| 8,996,956 | B2 | 3/2015 | Yang et al. |
| 9,025,405 | B2 | 5/2015 | Jeong |
| RE45,771 | E | 10/2015 | Sprouse et al. |
| 2011/0010484 | A1 | 1/2011 | Sprouse et al. |
| 2013/0279284 | A1 | 10/2013 | Jeong |
| 2014/0177370 | A1 | 6/2014 | Halbert et al. |
| 2015/0003179 | A1 | 1/2015 | Song |
| 2015/0026538 | A1* | 1/2015 | Sakai ................ G06F 11/1048 714/764 |
| 2015/0063049 | A1 | 3/2015 | Yang |
| 2015/0162078 | A1 | 6/2015 | Muralimanohar et al. |
| 2015/0162099 | A1 | 6/2015 | Jeong et al. |
| 2015/0213871 | A1 | 7/2015 | Jeong |
| 2015/0248327 | A1* | 9/2015 | Ware .................... G11C 29/42 714/773 |
| 2016/0351248 | A1 | 12/2016 | Jung |
| 2017/0038969 | A1 | 2/2017 | Choi et al. |

FOREIGN PATENT DOCUMENTS

| | | |
|---|---|---|
| KR | 1020140070303 A | 6/2014 |
| KR | 1020150002112 A | 1/2015 |
| KR | 1020150015012 A | 2/2015 |
| KR | 1020150026227 A | 3/2015 |

\* cited by examiner

SEMICONDUCTOR DEVICE

CROSS-REFERENCES TO RELATED APPLICATION

The present application claims priority under 35 U.S.C. §119(a) to Korean application number 10-2015-0157004, filed on Nov. 9, 2015, in the Korean Intellectual Property Office, which is incorporated herein by reference in its entirety.

BACKGROUND

1. Technical Field

Various embodiments generally relate to a semiconductor device, and more particularly, to a semiconductor device including an error correction code circuit.

2. Related Art

As a voltage applied to a memory cell is lowered and a cell size is reduced, deterioration of soft error tolerance has been problematic. In a semiconductor integrated device using an error correction code (hereinafter, referred to as ECC) circuit for correcting a data error, a circuit technology of adding a parity bit to typical data and correcting a failed bit has been proposed.

That is, after a semiconductor memory device is fabricated, a test is performed to select failed memory cells. One of method for improving the yield of the semiconductor memory device is to provide an ECC function to the semiconductor memory device.

Such an ECC circuit is a circuit that performs a function of detecting and correcting in realtime fail of data, and an additional parity bit is applied to DQ data when the DQ data is transmitted. Thus, the semiconductor memory device checks whether the DQ data and the added parity bit are transmitted according to the prescribed rules and detects a data error.

However, an on-die ECC circuit can correct 1-bit fail but can only detect an error with respect to 2-bit fail. That is, since an address in which the 1-bit fail has occurred is further deteriorated later, an addition failed cell may be generated. In such a case, a data error may occur, resulting in an increase in the number of cells to be replaced with redundant cells in a repair operation.

SUMMARY

In an embodiment, a semiconductor device includes a bank including a memory area for storing data and an error correction for storing parity data. The semiconductor device also includes an error correction code calculation circuit that corrects an error of a failed cell in correspondence to the data and the parity data and outputs a flag signal activated at a time of a generation of failed data and an address activated in the bank. The semiconductor device also includes an address latch circuit that stores the address applied from the error correction code calculation circuit and outputs a failed address according to the flag signal. The semiconductor device also includes a fail prevention circuit that performs an operation for repairing the failed data in correspondence to the flag signal and the failed address.

In an embodiment, a semiconductor device may include a plurality of banks including a memory area and an error correction code (ECC) area. The semiconductor device may also include an error correction code calculation circuit electrically coupled to the plurality of banks and configured to receive data from the memory area and parity data from the ECC area and perform an ECC operation in a normal active mode. The semiconductor device may also include an address latch circuit configured to store activated row addresses from the error correction code calculation circuit and output a failed address. The semiconductor device may also include a fail prevention circuit configured to receive the failed address and perform an operation to repair failed data according to the failed address and a flag signal.

Wherein the fail prevention circuit outputs one of the row addresses to the plurality of banks.

Wherein the one of the row addresses is outputted to the plurality of banks according to the failed address.

Wherein the fail prevention circuit is configured to control a number of refresh operations.

Wherein the fail prevention circuit is configured to sequentially store the failed address in a predetermined number of lines.

Wherein the fail prevention circuit outputs a refresh address to sequentially refresh an entire memory cell array.

Wherein the fail prevention circuit is configured to output the one of the row addresses according to a first refresh address or a second refresh address.

Wherein the second refresh address is selected when a row active signal is at a first logic level, and the first refresh address is selected when the row active signal is at a second logic level.

Wherein the ECC calculation circuit reads the data of the memory area and the parity data of the ECC area and performs an error correction operation.

Wherein the ECC calculation circuit outputs error-corrected data to an input/output circuit.

Wherein the ECC calculation circuit detects when the failed data is generated.

Wherein the address latch circuit outputs the failed address to the fail prevention circuit when the flag signal is activated.

Wherein the ECC calculation circuit is configured to correct an error in correspondence to the data and parity data when a 1-bit fail occurs.

Wherein the address latch circuit outputs the failed address to the fail prevention circuit when a fail occurs in one or more of the plurality of banks.

DETAILED DESCRIPTION

Hereinafter, a semiconductor device will be described below with reference to the accompanying figures through various examples of embodiments. Various embodiments are directed to repair a corresponding cell by using an error correction code (ECC) circuit when 1-bit fail occurs, and to substantially prevent advanced fail from occurring by substantially preventing an error from occurring in the corresponding cell. According to the invention, when 1-bit fail occurs, a corresponding cell is repaired using an error correction code (ECC) circuit, and an error is substantially prevented from occurring in the corresponding cell, thereby substantially preventing advanced fail from occurring.

Figure 1:
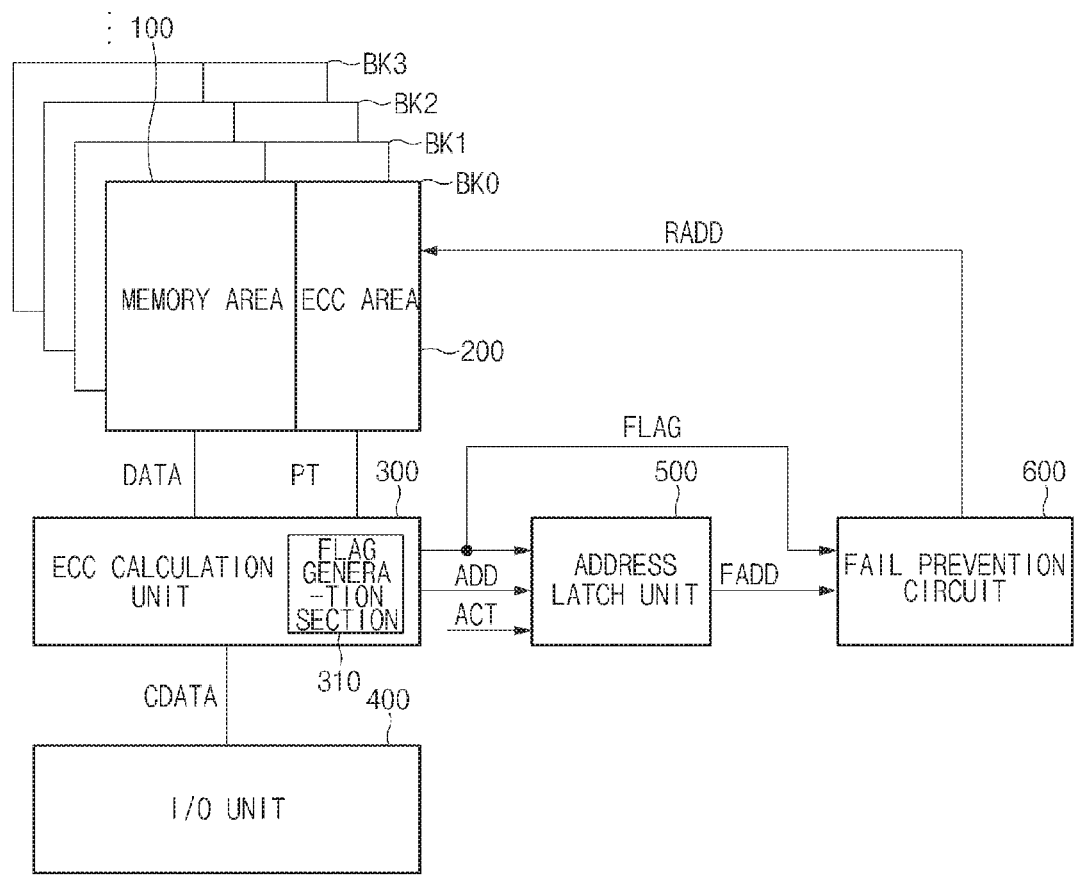
FIG. 1 is a configuration diagram illustrating a semiconductor device according to an embodiment of the invention.

Referring to FIG. 1, a configuration diagram illustrating a semiconductor device according to an embodiment of the invention is described. The internal components of the semiconductor device may be configured as a circuit or the like.

An embodiment of the invention includes a plurality of banks BK0 to BK3, an error correction code (hereinafter, referred to as ECC) calculation unit 300, an input/output unit 400, an address latch unit 500, and a fail prevention circuit 600.

The semiconductor device is divided into the plurality of banks BK0 to BK3 and is driven. Each of the plurality of banks BK0 to BK3 includes a memory area 100 and an ECC area 200.

The memory area 100 includes a plurality of memory cells and data read/write is performed therein. The ECC area 200 stores parity data for correcting an error.

The memory area 100 is divided into sets of normal mats including a plurality of unit memory cells. These normal mats are arranged in a plural number in a row direction and a column direction to form a plurality of mat rows and a plurality of mat columns.

An area arranged at the outermost peripheral portion of the memory area 100 may be used as the ECC area 200 for storing parity bits. Such an ECC area 200 may be assigned to a dummy area.

The ECC calculation unit 300 is electrically coupled to the plurality of banks BK0 to BK3 through data lines and parity lines. The ECC calculation unit 300 receives data DATA of a specific unit from the memory area 100 through the data lines, and receives parity data PT of a specific unit from the ECC area 200 through the parity lines. The ECC calculation unit 300 may be applied to an on-die ECC circuit provided in a die of the semiconductor device.

As described above, the data lines for inputting/outputting the normal data DATA and the parity lines for inputting/outputting the parity data PT are separated from each other. In such a case, in a write or read operation, data may be inputted/outputted through the data lines separately from the parity lines.

The ECC calculation unit 300 performs an ECC operation in correspondence to a read or write command in a normal active mode. When 1-bit fail occurs, such an ECC calculation unit 300 corrects an error in correspondence to the data DATA and the parity data PT.

In a read operation of the banks BK0 to BK3, the ECC calculation unit 300 reads all of the data DATA of the memory area 100 and the parity data PT of the ECC area 200, and performs an error correction operation. Furthermore, in a write operation of the banks BK0 to BK3, the ECC calculation unit 300 stores data in the memory area 100 and stores parity data in the ECC area 200.

The ECC calculation unit 300 calculates ECCs in correspondence to the data DATA and the parity data PT applied from the plurality of banks BK0 to BK3 through the data lines and the parity lines; and outputs error-corrected data CDATA to the input/output unit 400. Then, the input/output unit 400 outputs the error-corrected data CDATA to an exterior source or device.

Furthermore, the ECC calculation unit 300 outputs a flag signal FLAG, which is activated at the time of generation of failed data, to the address latch unit 500 and the fail prevention circuit 600. To this end, the ECC calculation unit 300 includes a flag generation section 310 for detecting the generation of the failed data and activating the flag signal FLAG. The ECC calculation unit 300 outputs row addresses ADD activated according to the respective banks BK0 to BK3 to the address latch unit 500.

The address latch unit 500 stores the activated row addresses ADD applied from the ECC calculation unit 300. When the flag signal FLAG is activated, the address latch unit 500 outputs a stored failed address to the fail prevention circuit 600.

The address latch unit 500 sequentially stores the activated row addresses ADD in a latch in synchronization with an active command. The address latch unit 500 latches and stores the row addresses ADD until a precharge operation is performed.

When fail occurs in a specific bank and the flag signal FLAG is activated from the ECC calculation unit 300, the address latch unit 500 outputs a failed address FADD corresponding to failed data to the fail prevention circuit 600.

The address latch unit 500 may be provided in each bank BK one by one. For example, when the number of banks BK0 to BK3 is 4, four address latch units 500 may be provided.

The address latch unit 500 latches the activated row addresses ADD and outputs the latched row addresses ADD to the fail prevention circuit 600 while the ECC calculation unit 300 is performing ECC calculation. At this time, the address latch unit 500 outputs the failed address FADD latched at the time of activation of the flag signal FLAG to the fail prevention circuit 600.

The address latch unit 500 may latch row address information until row addresses are applied to row lines of the banks BK0 to BK3 and column addresses are applied to column lines. Until the row addresses are applied and the column addresses are applied in order to select memory cells of the banks BK0 to BK3, a predetermined time is required.

Therefore, when the row address ADD applied from the ECC calculation unit 300 are not stored until the row addresses are applied and the column addresses are applied, information on failed addresses may be lost. In this regard, in an embodiment of the invention, the row address ADD applied from the ECC calculation unit 300 through the address latch unit 500 is stored for a predetermined time.

Furthermore, the fail prevention circuit 600 performs an operation for repairing failed data in correspondence to the flag signal FLAG and the failed address FADD. An address in which 1-bit fail has occurred may be corrected by the ECC calculation unit 300. However, when additional 1-bit fail occurs again after the 1-bit fail occurs, it is not possible to correct failed cells.

In this regard, in an embodiment of the invention, when 1-bit fail occurs, an error is corrected by the ECC calculation unit 300 and the fail prevention circuit 600 repairs failed cells such that additional fail is substantially prevented from occurring in corresponding cells. When an error has occurred in the banks BK0 to BK3, the fail prevention circuit 600 substantially prevents an error from occurring in a corresponding address of failed data.

Circuits for substantially preventing an error from occurring in a failed address may be various. In an embodiment of the invention, an address in which fail has occurred is regarded to correspond to a weak cell and an additional refresh operation is performed for a failed cell so that an error is substantially prevented from occurring in the corresponding address.

Such a fail prevention circuit 600 outputs a row address RADD to the banks BK0 to BK3 to refresh failed cells, thereby repairing failed data.

Furthermore, the fail prevention circuit 600 outputs, to the banks BK0 to BK3, a row address RADD for refreshing failed cells in correspondence to the failed address FADD at the time of activation of the flag signal FLAG.

Furthermore, the fail prevention circuit 600 may also adjust the number of refreshes on the basis of an address of at least one weak cell having a data retention time shorter than that of a normal cell among a plurality of memory cells. The fail prevention circuit 600 may control a refresh operation to be performed for weak cells at least twice in a refresh cycle defined in the standard.

In a test mode, the fail prevention circuit 600 performs a refresh operation and stores address information on cells having weak address characteristics. Furthermore, when the failed address FADD corresponds to a weak cell, the fail prevention circuit 600 may control the number of refresh operations to increase.

A volatile memory device such as a dynamic random access memory (DRAM) performs a refresh operation in order to substantially maintain stored data. When a memory cell of the volatile memory device has a data retention time shorter than the refresh cycle defined in the standard, row lines including the memory cell should be replaced with row lines of a redundancy cell.

As the size of a memory cell is reduced, the number of memory cells having a data retention time shorter than the refresh cycle increases, resulting in an increase in the number of redundancy cells.

Accordingly, it is necessary to adaptively perform a refresh operation according to data retention characteristics of respective memory cells while substantially maintaining refresh time intervals according to the standard of a semiconductor device. In the case of adaptively performing the refresh operation according to the data retention characteristics of the respective memory cells, it is possible to reduce the number of row lines of a memory cell which should be replaced with row lines of a redundancy cell.

In an embodiment of the invention, the example, in which the fail prevention circuit 600 repairs a failed cell by performing an addition refresh operation for the failed address FADD has been described. However, the invention is not limited thereto. The fail prevention circuit 600 may also repair a failed cell through a soft fail method.

In the soft fail method, when fail has occurred in a specific row address, it is possible to perform an operation for replacing it with a redundant word line. Accordingly, it is possible to use a word line copy method in which the fail prevention circuit 600 stores data stored in a cell in the redundant word line.

It is possible to a method in which a failed word line is enabled to latch data through a sense amplifier and then the redundant word line is enabled to allow substantially the same data to be written in the redundant word line through the sense amplifier.

Figure 2:
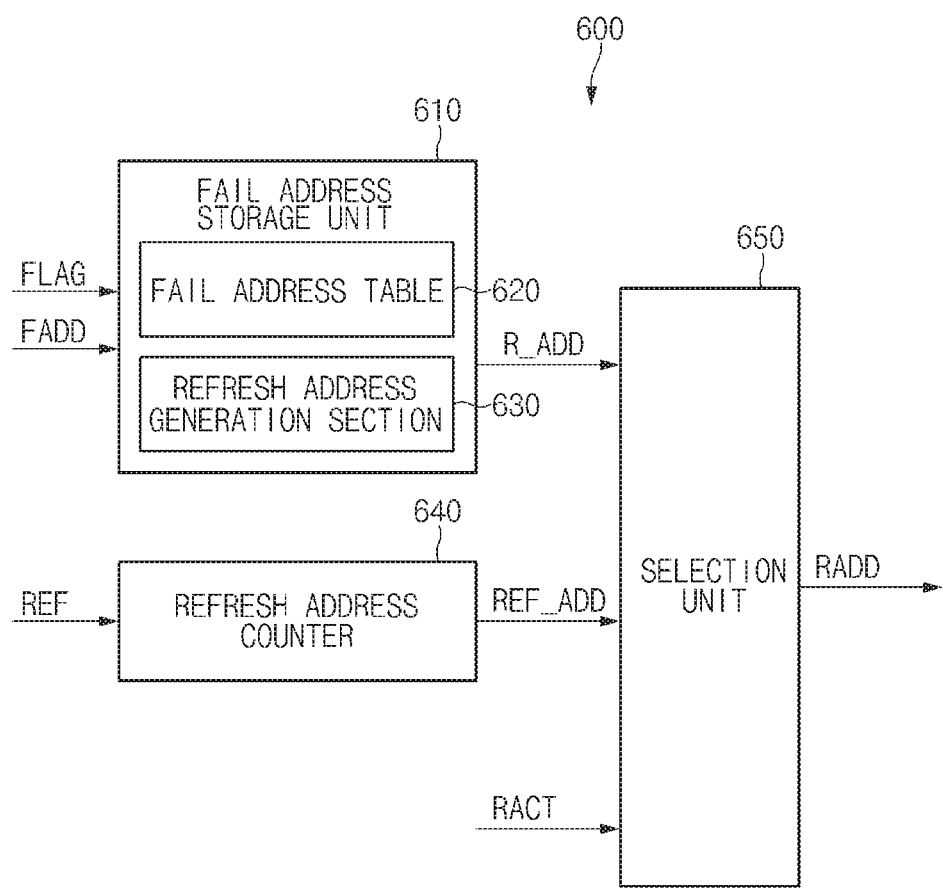
FIG. 2 is a diagram illustrating an embodiment regarding a fail prevention circuit of FIG. 1.

Referring to FIG. 2, a detailed configuration diagram of the fail prevention circuit 600 of FIG. 1 is described.

The fail prevention circuit 600 includes a failed address storage unit 610, a refresh address counter 640, and a selection unit 650. The failed address storage unit 610 includes a failed address table 620 and a refresh address generation section 630.

The failed address storage unit 610 stores the failed address FADD applied from the address latch unit 500 in the failed address table 620 at the time of activation of the flag signal FLAG. The failed address FADD may be sequentially stored in a predetermined number of lines of the failed address table 620. The failed address table 620 may include a latch unit.

The failed address table 620 may include a table address field indicating addresses of each line and a refresh address field in which the failed address FADD requiring a refresh operation is stored.

In the refresh address field, a refresh address corresponding to the failed address FADD may be stored as bit information. A refresh address R_ADD stored in the failed address table 620 may be sequentially outputted by the refresh address generation section 630.

For example, the refresh address generation section 630 may sequentially output the failed address FADD stored in the failed address table 620 as the refresh address R_ADD by the operation of the counter at the time of activation of the flag signal FLAG. The refresh address generation section 630 outputs the failed address FADD, which has been stored in each line of the failed address table 620, as the refresh address R_ADD for performing a refresh operation.

In an embodiment of the invention, the example, in which the failed address table 620 includes a latch unit has been described. However, the invention is not limited thereto. The failed address table 620 may be implemented with a one-time programmable memory such as a laser programmable fuse memory, an anti-fuse memory, and an electrical programmable fuse memory, or may be implemented with a nonvolatile memory such as a MRAM (Magnetic Random Access Memory), a RRAM (Resistance Random Access Memory), a PRAM (Phase change Random Access Memory), and a flash memory.

In the case of a normal operation, a refresh operation is performed in correspondence to the refresh address counter 640. The refresh address counter 640 counters a refresh signal REF and outputs a refresh address REF_ADD for sequentially refreshing an entire memory cell array.

The refresh signal REF may be generated in response to a refresh command periodically applied from a host apparatus. The refresh signal REF may be an auto-refresh signal applied by a command from a memory controller in a normal access mode of the semiconductor device. Furthermore, the refresh signal REF may also be generated by a built-in timer included in the semiconductor device.

The selection unit 650 selects any one of the refresh address R_ADD applied from the failed address storage unit 610 and the refresh address REF_ADD applied from the refresh address counter 640 in correspondence to a row active signal RACT, and outputs the row address RADD.

For example, when the row active signal RACT is at a first logic level (for example, a logic high level), the selection unit 650 selects the refresh address REF_ADD applied from the refresh address counter 640. However, the row active signal RACT is at a second logic level (for example, a logic ow level), and the selection unit 650 selects the refresh address R_ADD applied from the failed address storage unit 610.

The selection unit 650 may include a multiplexer, a transmission gate and the like for selecting any one of the refresh address R_ADD and the refresh address REF_ADD in correspondence to the row active signal RACT.

The semiconductor device according to an embodiment of the invention may be a dynamic random access memory (DRAM) such as a DDR SDRAM (Double Data Rate Synchronous Dynamic Random Access Memory), a LPDDR (Low Power Double Data Rate) SDRAM, a GDDR (Graphics Double Data Rate) SDRAM, a RDRAM (Rambus Dynamic Random Access Memory), or may be an arbitrary volatile memory device requiring a refresh operation.

While various embodiments have been described above, it will be understood to those skilled in the art that the embodiments described are by way of examples only. Accordingly, the semiconductor device described herein should not be limited based on the described embodiments.

Figure 3:
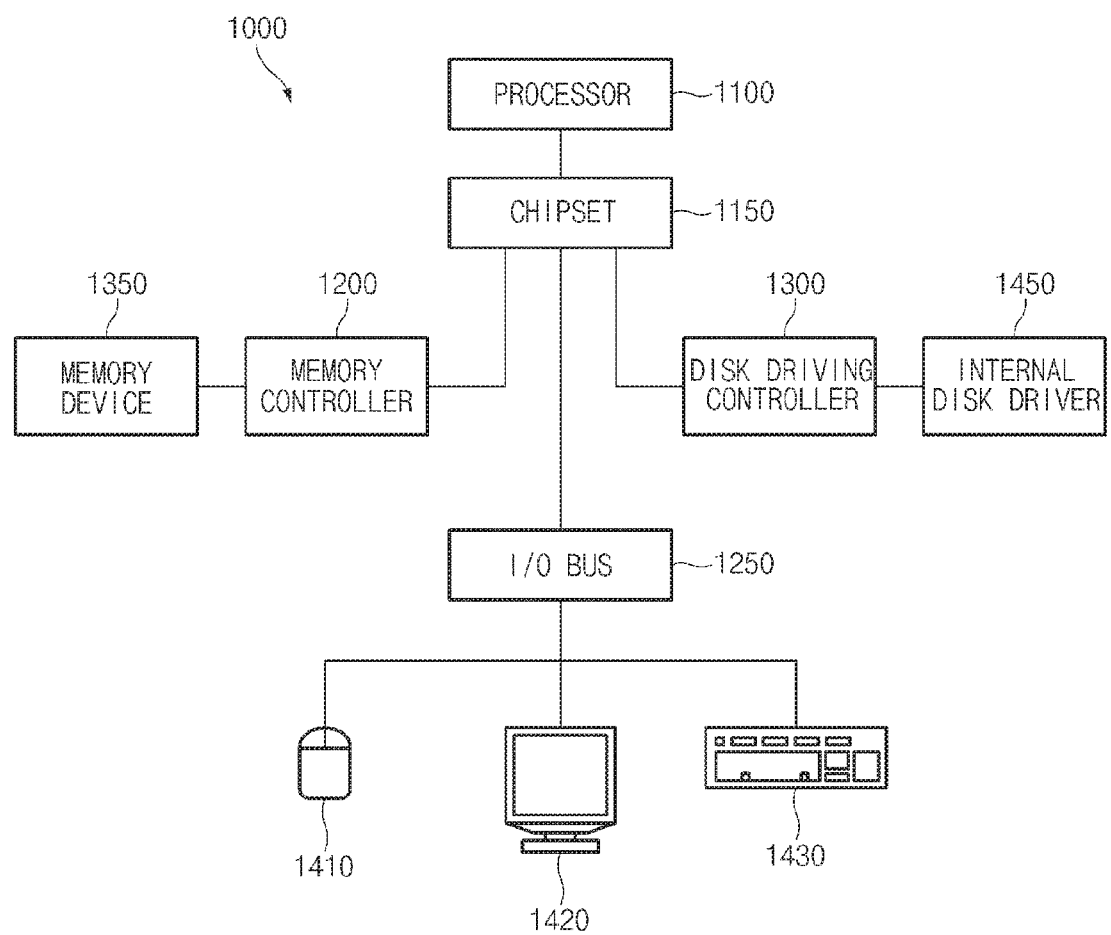
FIG. 3 is a configuration diagram illustrating a system including a semiconductor device according to an embodiment of the invention.

The semiconductor devices discussed above (see FIGS. 1, 2) are particular useful in the design of memory devices, processors, and computer systems. For example, referring to FIG. 3, a block diagram of a system employing a semiconductor device in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driving controller 1300. Depending on the configuration of the system 1000, any one of a number of different signals may be transmitted through the chipset 1150. Those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor device as discussed above with reference to FIGS. 1, 2. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor device as discussed above with relation to FIGS. 1, 2, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be electrically coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driving controller 1300 may be operably coupled to the chipset 1150. The disk driving controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driving controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 3 is merely one example of a system 1000 employing a semiconductor device as discussed above with relation to FIGS. 1, 2. In alternate embodiments, such as, for example but not limited to, cellular phones or digital cameras, the components may differ from the embodiments illustrated in FIG. 3.

Those skilled in the art will appreciate that the embodiments may be carried out in other specific ways than those set forth herein without departing from the spirit and essential characteristics of the invention. The above embodiments are therefore to be construed in all aspects as illustrative and not restrictive. The scope should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment of the invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this invention. Particularly, numerous variations and modifications are possible in the component parts and/or arrangements which are within the scope of the invention, the figures and the accompanying claims. In addition to variations and modifications in the component parts and/or arrangements, alternative uses will also be apparent to those skilled in the art.

What is claimed is:

1. A semiconductor device comprising:
   a bank including a memory area for storing data and an error correction code area for storing parity data;
   an error correction code calculation circuit that corrects an error of a failed cell in correspondence to the data and the parity data and outputs a flag signal activated at a time of a generation of failed data and an address activated in the bank;
   an address latch circuit that stores the address applied from the error correction code calculation circuit and outputs a failed address according to the flag signal; and
   a fail prevention circuit that performs an operation for repairing the failed data in correspondence to the flag signal and the failed address,
   wherein the error correction code calculation circuit comprises:
   a flag generation section that detects the generation of the failed data and activates the flag signal.

2. The semiconductor device of claim 1, wherein the error correction code calculation circuit corrects an error when a 1-bit fail occurs.

3. The semiconductor device of claim 1, wherein the address latch circuit is provided per the bank one by one.

4. The semiconductor device of claim 1, wherein the address latch circuit sequentially stores a row address in synchronization with an active command.

5. The semiconductor device of claim 1, wherein the address latch circuit latches a row address until a precharge operation starts.

6. The semiconductor device of claim 1, wherein the address latch circuit latches the address until a row address is applied to a row line of the bank and a column address is applied to a column line.

7. The semiconductor device of claim 1, wherein the fail prevention circuit controls a refresh operation to be performed for the failed address.

8. The semiconductor device of claim 1, wherein the fail prevention circuit outputs a row address for refreshing the failed cell to the bank in correspondence to the failed address at a time of an activation of the flag signal.

9. The semiconductor device of claim 1, wherein the fail prevention circuit controls a soft repair operation such that data of the failed cell is latched in the bank and a redundant word line is enabled to write substantially a same data in a redundant cell.

10. The semiconductor device of claim 1, wherein the fail prevention circuit outputs a first refresh address in correspondence to the failed address at a time of an activation of the flag signal, and outputs a second refresh address in correspondence to a refresh signal in a normal operation.

11. The semiconductor device of claim 1, wherein the fail prevention circuit comprises:
a refresh address counter that counts a refresh signal in a normal operation and outputs a first refresh address;
a failed address storage circuit that stores the failed address at a time of an activation of the flag signal and outputs a second refresh address corresponding to the failed address; and
a selection circuit that selects the first refresh address or the second refresh address in correspondence to a row active signal.

12. The semiconductor device of claim 11, wherein the failed address storage circuit sequentially stores the failed address.

13. The semiconductor device of claim 11, wherein the failed address storage circuit comprises:
a failed address table that stores the failed address; and
a refresh address generation section that outputs the second refresh address in correspondence to the failed address.

14. The semiconductor device of claim 13, wherein the refresh address generation section comprises:
a counter that sequentially outputs the second refresh address.

15. The semiconductor device of claim 11, wherein the refresh signal is generated in response to a refresh command periodically applied from an external host apparatus.

16. The semiconductor device of claim 11, wherein the refresh signal includes an auto-refresh signal applied by a command of an external memory controller.

17. The semiconductor device of claim 11, wherein the selection circuit selects the first refresh address and outputs a row address when the row active signal is at a first logic level, and selects the second refresh address and outputs the row address when the row active signal is at a second logic level.

18. A semiconductor device comprising:
a plurality of banks including a memory area and an error correction code (ECC) area;
an error correction code calculation circuit electrically coupled to the plurality of banks and configured to receive data from the memory area and parity data from the ECC area and perform an ECC operation in a normal active mode;
an address latch circuit configured to store activated row addresses from the error correction code calculation circuit and output a failed address; and
a fail prevention circuit configured to receive the failed address and perform an operation to repair failed data according to the failed address and a flag signal,
wherein the address latch circuit is provided per the bank one by one.

19. The semiconductor device of claim 18, wherein fail prevention circuit is configured to repair failed cells of an additional 1-bit fail.

20. A semiconductor device comprising:
a bank including a memory area for storing data and an error correction code area for storing parity data;
an error correction code calculation circuit that is configured to output an address activated in the bank, correct an error of a failed cell in correspondence to the data and the parity data and output a flag signal activated when detecting the error of the failed cell;
an address latch circuit that is configured to store the activated address applied from the error correction code calculation circuit and outputs, based on the flag signal, the activated address as a failed address; and
a fail prevention circuit that performs an operation for repairing the failed cell in correspondence to the flag signal and the failed address.

21. A semiconductor device comprising:
a plurality of banks including a memory area and an error correction code (ECC) area;
an error correction code calculation circuit electrically coupled to the plurality of banks and configured to receive data from the memory area and parity data from the ECC area, perform an ECC operation, and output a flag signal activated when detecting an error;
an address latch circuit configured to store activated a row address and generate a failed address by using the flag signal and the activated address; and
a fail prevention circuit configured to receive the failed address and perform an operation to repair a failed cell according to the failed address.

* * * * *